United States Patent
Azotea et al.

[11] Patent Number: 6,157,076
[45] Date of Patent: *Dec. 5, 2000

[54] HERMETIC THIN PACK SEMICONDUCTOR DEVICE

[75] Inventors: James Azotea, Saratoga Springs; Victor A. K. Temple, Clifton Park, both of N.Y.

[73] Assignee: Intersil Corporation, Palm Bay, Fla.

[*] Notice: This patent issued on a continued prosecution application filed under 37 CFR 1.53(d), and is subject to the twenty year patent term provisions of 35 U.S.C. 154(a)(2).

[21] Appl. No.: 08/885,923

[22] Filed: Jun. 30, 1997

[51] Int. Cl.⁷ ............................................. H01L 23/02
[52] U.S. Cl. ................... 257/679; 257/678; 257/684; 257/700; 257/701; 257/703; 257/704; 257/705; 257/710; 257/728; 257/729; 257/779
[58] Field of Search ................... 257/679, 728, 257/729, 704, 710, 701, 703, 705, 678, 684, 779, 700

[56] References Cited

U.S. PATENT DOCUMENTS

| | | |
|---|---|---|
| 3,176,382 | 4/1965 | Dickson, Jr. et al. . |
| 3,576,474 | 4/1971 | Huber et al. . |
| 3,591,839 | 7/1971 | Evans . |
| 3,657,610 | 4/1972 | Yamamoto et al. . |
| 4,774,633 | 9/1988 | Dehaine et al. ............... 361/398 |
| 5,028,987 | 7/1991 | Neugebauer et al. ............... 357/80 |
| 5,034,044 | 7/1991 | Glascock, II . |
| 5,103,290 | 4/1992 | Temple et al. . |
| 5,135,890 | 8/1992 | Temple et al. . |
| 5,139,972 | 8/1992 | Neugebauer et al. ............... 433/209 |
| 5,166,773 | 11/1992 | Temple et al. ............... 257/678 |
| 5,184,206 | 2/1993 | Neugebauer et al. . |
| 5,209,390 | 5/1993 | Temple et al. . |
| 5,248,901 | 9/1993 | Temple . |
| 5,366,932 | 11/1994 | Temple . |
| 5,446,316 | 8/1995 | Temple et al. ............... 257/704 |
| 5,446,326 | 8/1995 | Temple et al. ............... 257/704 |
| 5,517,058 | 5/1996 | Temple . |
| 5,521,436 | 5/1996 | Temple ............... 257/698 |
| 5,656,857 | 8/1997 | Kishita . |
| 5,808,358 | 9/1998 | Vinciarelli et al. ............... 257/700 |

FOREIGN PATENT DOCUMENTS

| | | |
|---|---|---|
| 0 615 289 A | 9/1994 | European Pat. Off. . |
| 0615289 A2 | 9/1994 | European Pat. Off. ...... H01L 23/055 |
| 94/22168 | 9/1994 | WIPO . |

*Primary Examiner*—Mahshid Saadat
*Assistant Examiner*—Matthew E. Warren
*Attorney, Agent, or Firm*—Rogers & Killeen

[57] ABSTRACT

A hermetic thin pack semiconductor device. The semiconductor device has a semiconductor substrate and at least one electrode on the upper surface of the semiconductor substrate. A lid of a ceramic material for the semiconductor device has at least one opening extending through the lid. A first electrically conductive material is located on the interior surface of the at least one opening, a second electrically conductive material is located on at least a portion of the upper surface of the lid, and a third electrically conductive material is located on at least a portion of the lower surface of the lid. A solder material is positioned between the electrode and the third electrically conductive material and positioned on a corresponding portion of the electrode opposite a corresponding opening in the lid.

3 Claims, 2 Drawing Sheets

HERMETIC THIN PACK SEMICONDUCTOR DEVICE

BACKGROUND OF THE INVENTION

This invention relates to semiconductor devices, and more particularly to the assembly and packaging of such devices.

The packaging of the semiconductor device serves to protect the device from the environment in which it is to be used, as well as to provide electrical contacts for connection of the device within its environment.

Packaging for semiconductor devices are known in a variety of configurations, including those which are hermetic (gas-tight). Design criteria therefore leads to a consideration of the need to dissipate heat, the current and voltage capacity, and the topography of the semiconductor device.

For example, U.S. Patent No. 5,139,972 relates to low cost fabrication of hermetic thin packagings of high density power semiconductors, and to methods for fabrication by batch assembly. The method includes providing silicon chip arrays with thermocompressively bonded foil contacts, ceramic lid arrays which contain upper surface and lower margin direct-bonded copper coverings and through-the-lid high current conductors, such as spherical conductors, coining cup arrays, such as from copper, die mounting a semiconductor chip in each cup, registering the lid and cup arrays, and solder reflowing to hermetically seal the hermetic thin packagings.

U.S. Pat. No. 5,248,901 relates to semiconductor devices and methods for their assembly. This patent discloses a semiconductor device package including a cup-like base having an encircling side wall having at its upper end a laterally outwardly extending metal flange. A lid for the package includes a plate-like member having at the lower peripheral edge thereof an outwardly laterally extending metal flange which overlaps and is bonded to the base flange. The lid can have apertures therethrough which are sealed by metal foils bonded to the lower surface of the lid. The metal foils overlie and are bonded to electrodes on the upper surface of the chip within the package. The lid can also have a hollow tubing extending into each aperture in hermetic fit with the aperture wall. The chip within the semiconductor device package includes terminal leads extending into the tubings and hermetically bonded to the tubing inner walls.

U.S. Pat. No. 5,521,436 relates to a semiconductor device with a foil-sealed lid. The semiconductor device has a semiconductor substrate that includes a layer of metal on its upper surface along the substrate outer edge and spaced from the electrodes on the substrate upper surface. The ceramic plate forming a lid portion includes a copper foil on its lower surface along the outer edge thereof which overlaps and is bonded to the substrate metal layer. The ceramic plate has apertures that are sealed by copper foil on the package inside, with the foils being bonded to respective substrate electrodes.

U.S. Pat. No. 5,366,932 relates to a semiconductor chip packaging method and semiconductor chip having interdigitated gate runners with gate bonding pads. The gate runners overlie and contact selected gate electrodes on the chip surface, as well as have an integral widened area to enable bonding to a package-carried gate electrode contact foil. Also, the gate runners have portions that underlie a package-carried power electrode contact foil and are separated therefrom by a nonbondable, insulating layer. The portion of the power electrode on the chip surface that underlies the package-carried gate electrode contact foil is separated therefrom and available for use as an active chip area. Also, package lid-to-chip alignment tolerances may be relaxed as they are not dictated by alignment of the lid carried gate contact foil with the gate electrode on the chip.

Semiconductor devices for which the present invention may find application include various solid state power devices, such as, for example, MOSFETs, MOS gated semiconductor devices, MOS controlled thyristors (MCTs), insulated gate bipolar transistors(IGBTs), conductivity modulated field effect transistors (COMFETS), and other solid state power devices, including those having a cellular topography.

A goal in semiconductor device packaging is to provide smaller and lighter packaging for semiconductor devices at a reasonable cost and with reduced complexity.

A further goal in semiconductor device packaging is to achieve a hermetically sealed semiconductor device package of reasonable cost, durability, and simplicity.

Accordingly, it is an object of the present invention to provide a novel hermetic thin pack semiconductor device of reasonable cost.

It is another object of the present invention to provide a novel hermetic thin pack semiconductor device that is durable and simple in construction.

It is yet another object of the present invention to provide a novel hermetic thin pack semiconductor device that promotes ease of manufacture.

It is still another object of the present invention to provide a novel thin pack semiconductor device for use in high density power packages.

It is a further object of the present invention to provide a novel thin pack semiconductor device for solid state power devices having a cellular topography.

The present invention promotes the above objectives by providing a thin pack semiconductor device having a semiconductor substrate with at least one electrode of an electrically conductive material on at least a portion of the upper surface of the semiconductor substrate, and having a lid of a ceramic material, the lid having at least one opening. A first electrically conductive material is located on the interior surface of the at least one opening, a second electrically conductive material is located on at least a portion of the upper surface of the lid, and a third electrically conductive material is located on at least a portion of the lower surface of the lid. A solder material is positioned between the at least one electrode located on the upper surface of the semiconductor substrate and the third electrically conductive material located on the lower surface of the lid and positioned on a corresponding portion of the at least one electrode opposite a corresponding opening in the lid which may serve to hermetically seal the semiconductor device.

Preferably the first, second and third electrically conductive materials include copper.

It is also desirable that the solder material fills the at least one opening in the lid of the hermetic thin pack semiconductor device.

In some embodiments, it is further desirable that the solder material be positioned around an outer peripheral portion of the thin pack semiconductor device between the lower surface of the lid and the upper surface of the semiconductor substrate to complete a hermetic seal of the device. However, peripheral solder is not always needed or desired. For example, the periphery could be closed using a non-hermetic material or even could be left open. In the latter situation, an open periphery device could be placed, perhaps with other similar devices, within another package to provide any desired resistance to contamination and external environmental factors.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The present invention will now be described more fully with reference to the figures of the drawings which are illustrative of preferred embodiments of the hermetic thin pack semiconductor device of the present invention. In that the present invention may exist in various forms and embodiments, the invention should not be construed in a limiting sense.

Figure 1:
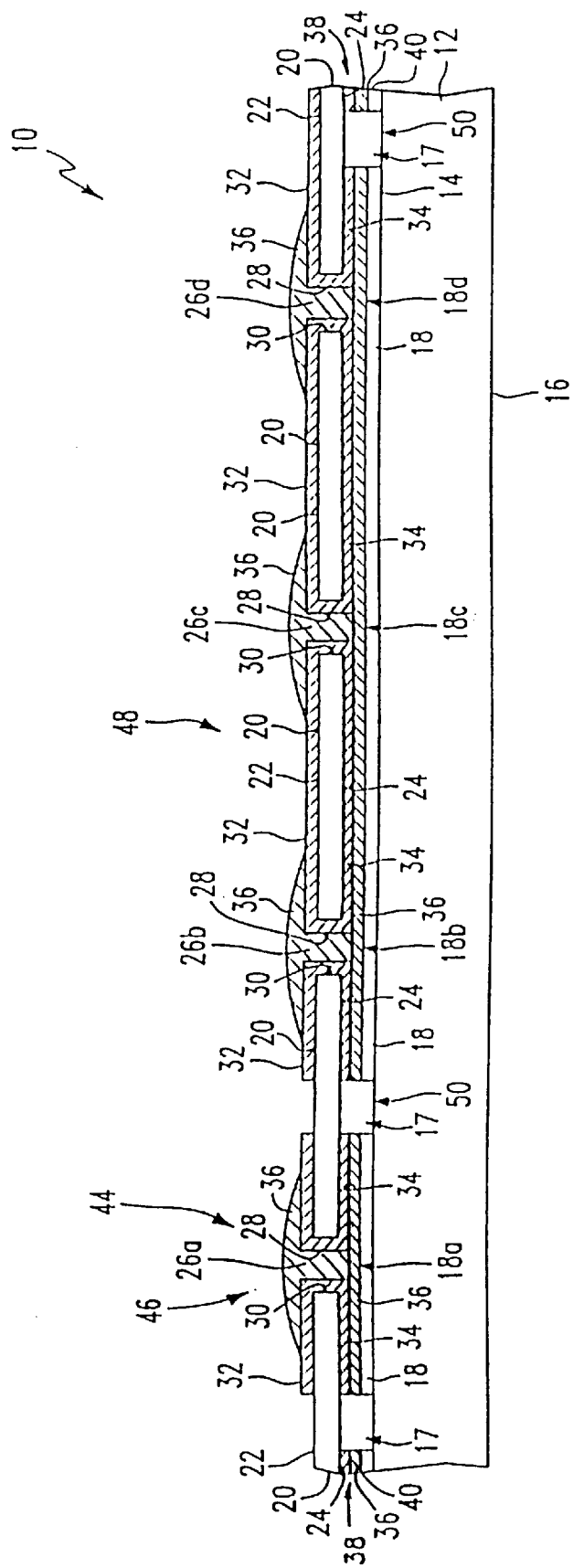
FIG. 1 is a sectional view illustrating the hermetic thin pack semiconductor device of the present invention.

Referring to FIG. 1, a preferred embodiment of the thin pack semiconductor device 10 of the present invention is illustrated. The thin pack semiconductor device 10 is formed of a semiconductor substrate 12. The semiconductor substrate 12 has an upper surface 14 and a lower surface 16, and semiconductor substrate 12 also has portions 17 for providing a hermetic environment to suppress arcing and electrical field effect issues of the high voltage terminations. The semiconductor substrate may be formed of various materials known to those skilled in the art. Dependent upon the particular application, the semiconductor substrate can be of a N conductivity type material, such as a N conductivity type silicon, having a P conductivity type implant, or a P conductivity type material, such as a P conductivity type silicon, having a N conductivity type implant, for example.

On at least a portion of the upper surface 14 of the semiconductor substrate 12 is located at least one electrode 18 of an electrically conductive material, the electrode being made of a material such as polycrystalline silicon, a plurality of electrodes 18 being illustrated in FIG. 1. The electrode 18 is formed by any of various methods known to those skilled in the art, such as a technique utilizing photomasking, deposition and patterning of the polycrystalline silicon material.

A lid 20 of a ceramic material, such as alumina, beryllia, or aluminum nitrite, is located over the semiconductor substrate 12, as shown in FIG. 1. The lid 20 has an upper 22 surface and a lower surface 24. The lid 20 has at least one opening, such as opening 26a, extending through the lid 20 from the upper surface 22 of the lid 20 to the lower surface 24 of the lid 20 and, typically, will have a plurality of such openings, such as openings 26a–d. The openings 26a–d can be formed by various known methods, such as drilling with a laser, a chemical etching process, or machining the openings.

Referring again to FIG. 1, a first electrically conductive material 28 is located on the interior surface 30 of at least one of the openings 26a–d. The first electrically conductive material 28 preferably includes copper, but may also include other electrically conductive materials, such as aluminum, tungsten, or molybdenum-manganese. The first electrically conductive material 28 may be deposited on the interior surface 30 of the openings 26a–d by various processes, such as electroless plating, and/or electroplating, for example. The thickness of the first electrically conductive material 28 is preferably in a range from 0.0005 inches to 0.003 inches.

A second electrically conductive material 32 is located on at least a portion of the upper surface 22 of the lid 20. The second electrically conductive material 32 preferably includes copper, but may also include other electrically conductive materials, such as aluminum, tungsten, molybdenum-manganese. The second electrically conductive material 32 can be deposited on the upper surface 22 of the lid 20 by various processes, such as electroless plating, electroplating, direct bonding, ion vapor deposition, for example. The thickness of the second electrically conductive material 32 is preferably in a range from 0.0005 inches to 0.003 inches.

A third electrically conductive material 34 is located on at least a portion of the lower surface 24 of the lid 20. The third electrically conductive material 34 preferably includes copper, but may also include other electrically conductive materials, such as aluminum, tungsten, molybdenum-manganese. The third electrically conductive material 34 can be deposited on the lower surface 24 of the lid 20 by various processes, such as electroless plating, electroplating, direct bonding, and/or ion vapor deposition, for example. The thickness of the third electrically conductive material 34 is preferably in a range from 0.0005 inches to 0.003 inches.

Also referring to FIG. 1, a solder material 36 is illustrated as being positioned between at least one electrode 18 located on the upper surface 14 of the semiconductor substrate 12 and the third electrically conductive material 34 located on the lower surface 24 of the lid 20. The solder material 36 is also illustrated in FIG. 1 as being positioned on a corresponding portion, such as one of electrode portions 18a–d, of at least one electrode 18 opposite a corresponding opening, such as a corresponding opening 26a–d, in the lid.

The solder material 36 is preferably formed on the device's top power electrode and can also be formed on an anode, emitter, and/or source by any of various techniques, such as solder electroplating, solder preforms, solder paste, and/or braze preforms. While various materials known to those skilled in the art can be used for the solder material 36, it is preferable the solder material 36 be Pb/Sn, Pb/Sn/Ag, Au/Ge, Au/Sn, and/or Au. Other materials, such as a tin-lead solder, gold solder, or lead-tin solder can be used for the solder material 36 depending upon the particular application.

Also, as illustrated in FIG. 1, the solder material 36 can desirably cover at least one opening, such as one of openings 26a–d, in the lid 20. Where the solder material 36 covers at least one opening, such as one of openings 26a–d, it is further desirable that the solder material 36 also cover at least a portion of the second electrically conductive material 32 on the upper surface 22 of the lid 20.

It is further desirable that the solder material 36 be positioned around an outer peripheral portion 38 of the semiconductor device 10 in a space 40 between the lower surface 24 of the lid 20 and the upper surface 14 of the semiconductor substrate 12 as illustrated in FIG. 1. The solder material 36 can be positioned in the space 40 by various techniques as previously mentioned, such as solder electroplating or solder preforms, solder paste and/or braze preforms.

It is preferable that after the solder material 36 has been positioned between the at least one electrode 18 and the third electrically conductive material 34 and on the electrode portion or portions 18a–d opposite a corresponding opening or openings 26a–d, various techniques as known to those skilled in the art be employed to promote a hermetic sealing of the semiconductor device 10. Such techniques would include a solder reflow process to heat the solder material 36, thermocompression bonding, or ultrasonic/thermal sonic scrub or a combination of such techniques, for example. The device/lid combination may be cleaned, dry baked and reflowed in dry nitrogen or hydrogen environment at from the Pb/Sn eutectic melting point of 183 degrees centigrade to 900 degrees centigrade.

The aforementioned techniques promoting hermetic sealing can likewise be applied as known to those skilled in the art with respect to solder material 36 positioned around the outer peripheral portion 38 of the semiconductor device 10 in the space 40 between the lower surface 24 of the lid 20 and the upper surface 14 of the semiconductor substrate 12. Moreover, as to the solder material 36 that fills or covers an opening or openings 26a–d in the lid 20, it is desirable to use solder reflow or braze reflow as described above for promotion of hermetic sealing of the semiconductor device 10.

In another embodiment of the present invention, the periphery of the device shown in FIG. 1 may be filled with a non-hermetic material or may be left open entirely. Such devices may not be considered hermetic but may be less costly to construct. If needed, even such non-hermetic devices may be made hermetic by encapsulating such devices within larger, hermetic packages. Such packaging may find particular use in power devices wherein plural individual semiconductor devices may be electrically connected to provide a device having a capability which is a function of the combination of the individual devices. The individual devices along with the necessary interconnections, all of which may be non-hermetic, may be enclosed within a single hermetic package to form a hermetic device having substantially increased properties over a single, individual device.

Figure 2:
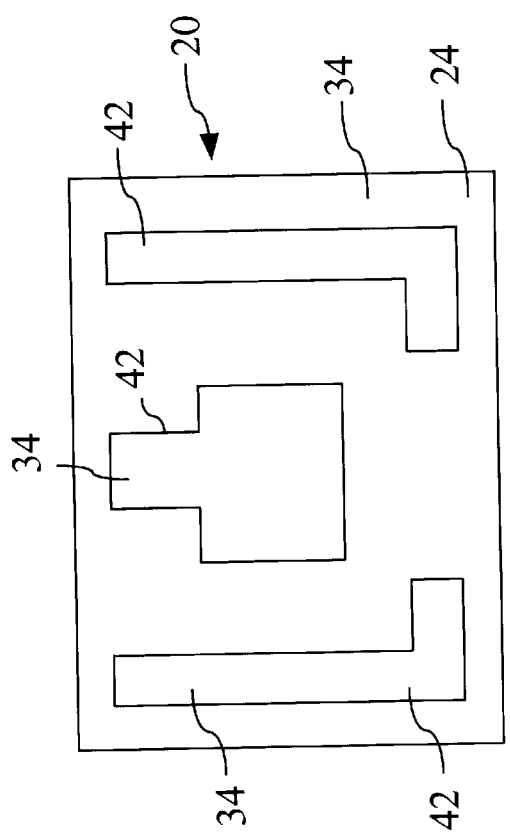
FIG. 2 shows a portion of the lower surface of the lid and the third electrically conductive material thereon formed to provide a conduction pattern in an embodiment of the hermetic thin pack semiconductor device of the present invention.

Referring to FIG. 2., there is illustrated a conduction pattern 42 formed in the third electrically conductive material 34 located on the lower surface 24 of the lid 20. Also, the solder material 36 positioned adjacently the conduction pattern 42 may be appropriately patterned to provide electrical connection with a respective portion of the at least one electrode 18.

The third electrically conductive material 34, such as copper, can be patterned by any of various methods known to those skilled in the art. Such methods could include, for example, a photomasking process. In such photomasking process, a photo resist is applied to the third electrically conductive material 34, followed by exposing, patterning and developing the photo resist. The exposed third electrically material 34, such as copper, could then be removed by an etching process with the remaining photo resist then removed to provide the desired conduction pattern.

The solder material 36 adjacent the conduction pattern 42, if desired, can likewise be appropriately patterned by screen printing, solder paste utilizing a solder preform.

Figure 3:
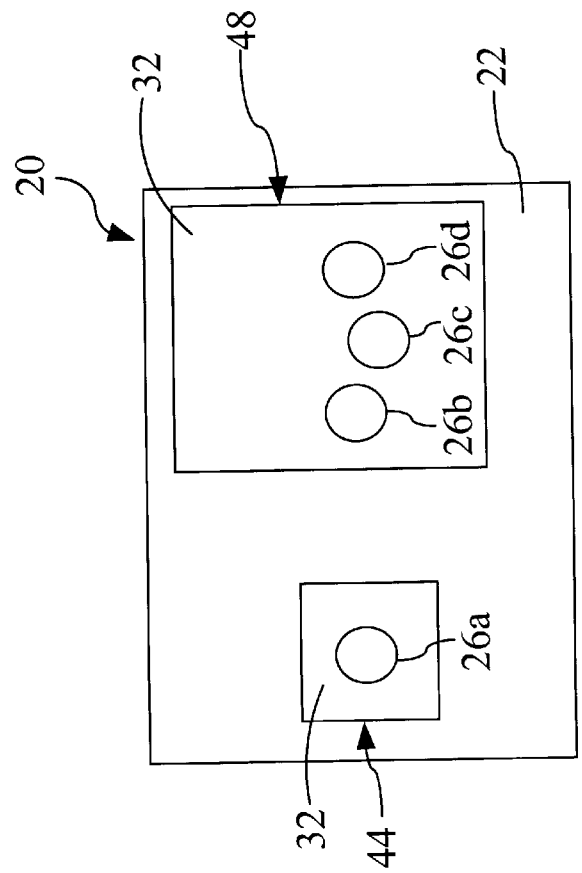
FIG. 3 shows a portion of the upper surface of the lid and the second electrically conductive material thereon, a gate area, a source area, and respective openings in these areas in an embodiment of the thin pack semiconductor device of the present invention.

Referring to FIGS. 1 and 3, a gate area 44 including a gate 46, as well as a source area 48 are illustrated. As shown in FIG. 1, the solder material 36 adjacent or within the openings 26a–d respectively provides an interconnection for the gate 46 of the gate area 44 and an interconnection for the source area 48 of the semiconductor device 10, the solder material 36 connecting the at least one electrode 18 and the third electrically conductive material 34, as well as providing a means for connection of the semiconductor device 10 to an external device (not shown), such as another semiconductor device.

FIG. 3 shows the gate area 44 and the source area 48 as viewed from the upper surface 22 of the lid 20. With respect to the gate area 44, there is illustrated the opening 26a surrounded by the second electrically conductive material 32. Likewise, as to the source area 48, there are illustrated openings 26b–d surrounded by the second electrically conductive material 32. The second electrically conductive material 32 can be desirably patterned as illustrated in FIG. 3, using the aforementioned techniques as used for forming the conduction pattern 42 in the third electrically conductive material 34 illustrated in FIG. 2.

As known to those skilled in the art, the materials and configuration of the semiconductor device 10, as well as the location, position, materials and configuration of the various active areas of the semiconductor device 10, such as gate area 44, source area 48 and drain area 50, can vary dependent upon the type of device, its function and use, as well as being a matter of choice of design.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A hermetic thin pack semiconductor device comprising:

a semiconductor substrate having an upper surface and a lower surface;

an electrode of an electrically conductive material located on said upper surface of said semiconductor substrate;

a lid of a ceramic material having an upper surface and a lower surface said lid having an opening extending through said lid from said upper surface of said lid to said lower surface of said lid, said opening being smaller in area than said electrode and said lid being positioned with respect to said substrate to vertically position said opening over a portion of said electrode;

a first electrically conductive material located on the surface of said lid which defines the opening through said lid;

a second electrically conductive material located on said upper surface of said lid;

a third electrically conductive material located on said lower surface of said lid; and a solder material filling said opening and extending laterally between said electrode and said third electrically conductive material over an area greater than the area of said opening in said lid to hermetically seal said semiconductor device;

wherein said solder material covers said second electrically conductive material located on said upper surface of said lid adjacent said opening to thereby provide a solder surface for electrically connecting said semiconductor device to a device external to said semiconductor device; and wherein said solder material is positioned around an outer peripheral portion of said semiconductor device and an outer peripheral portion of said lid between said lower surface of said lid and said upper surface of said semiconductor substrate.

2. A hermetic thin pack semiconductor device comprising:

a semiconductor substrate having an upper surface and a lower surface;

an electrode located on said upper surface of said semiconductor substrate;

a lid of a ceramic material having an upper surface and a lower surface, said lid having an opening extending through said lid from said upper surface of said lid to said lower surface of said lid;

a first electrically conductive material comprising copper located on the interior surface of said opening of said lid;

a second electrically conductive material comprising copper located on said upper surface of said lid;

a third electrically conductive material comprising copper located on said lower surface of said lid; and a solder material filing said opening and laterally extending beyond said opening between said electrode and said third electrically conductive material to thereby electrically connect said electrode to said third electrically conductive material without the direct bonding of copper and to hermetically seal the device;

wherein said solder material is positioned around an outer peripheral portion of said semiconductor device and an outer peripheral portion of said lid between said lower surface of said lid and said upper surface of said semiconductor substrate.

3. A hermetic thin pack semiconductor device, comprising:

a semiconductor substrate having an upper surface and a lower surface;

an electrode located on said upper surface of said semiconductor substrate;

a lid of a ceramic material having an upper surface and a lower surface said lid having an opening extending through said lid from said upper surface of said lid to said lower surface of said lid;

a first electrically conductive material comprising copper located on the interior surface of said opening of said lid;

a second electrically conductive material comprising copper located on said upper surface of said lid;

a third electrically conductive material comprising copper located on said lower surface of said lid; and a solder material filing said opening and laterally extending beyond said opening between said electrode and said third electrically conductive material to thereby electrically connect said electrode to said third electrically conductive material without the direct bonding of copper and to hermetically seal the device;

wherein said third electrically conductive material is formed to provide a conduction pattern; and wherein said solder material is positioned around an outer peripheral portion of said semiconductor device and an outer peripheral portion of said lid between said lower surface of said lid and said upper surface of said semiconductor substrate.

* * * * *